United States Patent [19]

Nakatani et al.

[11] Patent Number: 4,795,512

[45] Date of Patent: Jan. 3, 1989

[54] METHOD OF MANUFACTURING A MULTILAYER CERAMIC BODY

[75] Inventors: Seiichi Nakatani, Neyagawa; Tsutomu Nishimura, Uji; Satoru Yuhaku, Ikuno; Toru Ishida, Hirakata, all of Japan

[73] Assignee: Matsushita Electric Industrial Co., Ltd., Osaka, Japan

[21] Appl. No.: 18,579

[22] Filed: Feb. 25, 1987

[30] Foreign Application Priority Data

Feb. 26, 1986 [JP] Japan ................................. 61-41205
Mar. 6, 1986 [JP] Japan ................................. 61-48822
Apr. 1, 1986 [JP] Japan ................................. 61-74739

[51] Int. Cl.$^4$ .......................... B32B 18/00; H01B 1/06
[52] U.S. Cl. ......................................... 156/89; 427/96
[58] Field of Search .................... 156/89; 29/846, 851; 501/2, 11; 264/61, 63; 427/96; 106/1.22, 1.23; 252/518, 519

[56] References Cited

U.S. PATENT DOCUMENTS

| | | | |
|---|---|---|---|
| 3,852,877 | 12/1974 | Ahn | 156/89 |
| 4,504,339 | 3/1985 | Kamehara et al. | 156/89 |
| 4,551,357 | 11/1985 | Takeuchi | 427/96 |
| 4,567,111 | 1/1986 | Janikowski et al. | 427/96 |
| 4,649,125 | 3/1987 | Takeuchi et al. | 156/89 |
| 4,654,095 | 3/1987 | Steinberg | 156/89 |
| 4,679,320 | 7/1987 | Inanaka et al. | 156/89 |
| 4,714,570 | 12/1987 | Nakatani et al. | 106/1.22 |

Primary Examiner—Caleb Weston
Attorney, Agent, or Firm—Wenderoth, Lind & Ponack

[57] ABSTRACT

A method of manufacturing a multilayer ceramic using Cu as the conductor material is disclosed. This method comprises a step of forming a multilayer laminate by the green tape multilayer laminating method or by the thick film printing method on ceramic substrate with an insulating material with a mixture of ceramic and glass containing lead oxide as its main component and a conductor paste with CuO as its main component; a step of heat-treatment for decomposing and removing organic binder in air (binder removing process); a step of causing reduction at temperatures where copper oxide is reduced, but lead oxide is not, in a mixed gas atmosphere of nitrogen and hydrogen (reduction process); and a step of firing in a nitrogen atmosphere, thereby effecting sintering of the insulating material composed of ceramic and glass containing lead oxide and metallization of copper electrodes (firing process). For the uppermost layer electrodes, metal copper paste is employed, and a pattern printing process is conducted subsequent to the aforementioned reduction process, so that the sintering of the insulating material and the metallization of the uppermost layer are simultaneously performed; in this way, highly reliable uppermost layer Cu electrodes are obtainable.

12 Claims, 2 Drawing Sheets

METHOD OF MANUFACTURING A MULTILAYER CERAMIC BODY

BACKGROUND OF THE INVENTION

1. Field of the Invention

This invention relates to a method of manufacturing a multilayer ceramic body, such as a multilayer ceramic substrate, which mounts thereon semiconductor ICs and chips and interconnects them.

2. Description of the Prior Art

The multilayer ceramic substrate manufacturing methods are classified into three: a thick film method, a green tape printing method and a green tape laminating method.

The thick film method is represented by the hybrid IC, which employs thick film paste of conductors and dielectric and repeatedly applies to an already sintered ceramic substrate the screen process printing and firing to thereby form patterns. This method is relatively easy because the thick film paste is readily obtainable and the method itself is simple. Thus, this method is now widely in practical use. The thick film method, however, uses glass as the dielectric layer and is not so much multilayered, being limited to three to four layers. The screen process printing and firing are repeated for multilayering each layer to result in a long lead time and a high manufacturing cost. Also, the use of the sintered substrate will create a defect in that the through hole processing is difficult.

Next, the green tape printing method uses a ceramic sheet which is fabricated by the following process. A ceramic powder (e.g. alumina or beryllia as the main component) added with an organic binder, a plasticizer and a solvent, formed in slurry by use of a ball mill, and formed in a sheet-like film (called the green tape) by means of the doctor blade. The conductor paste uses high melting point metal, such as tungsten (W), molybdenum (Mo) or molybdenum-manganese (Mo-Mn), and the dielectric layer paste uses paste of an inorganic component having the same composition as the green tape material. In this method, the conductor paste and dielectric paste are printed alternately on the green tape to be multilayered, and after printing and drying, sintering is carried out at once. The sintering is usually carried out under a reducing atmosphere in which the high melting point metal is not oxidized. For example, 96% alumina is sintered at a temperature of 1600° C. The reducing atmosphere usually contains nitrogen and some water vapor gases including hydrogen gas of concentration of about 10% (as disclosed in, for example, "A FABRICATION TECHNIQUE FOR MULTILAYER CERAMIC MODULES", Solid State Technology 15, No. 5, P 35~40 (May, 1972)).

Such green tape using method is very advantageous and expected to be widely used in the future. Its advantages are as follows: Firstly, the sintering is carried out at once after the tape is printed and multilayered to thereby reduce manufacturing time. Secondly, the insulating layers are the same in composition as the substrate material and are sintered simultaneously so that a dense sintered body superior in thermal conductivity and airtightness is obtainable. Thirdly, the use of green tape increases processability, such as the through hole processing and is superior in fine printing efficiency. Fourthly, the use of metal, such as W, Mo or Mo-Mn, lowers a material cost in comparison with Au or Ag/Pd series conductor material. Fifthly, the sintered body is shrunk when sintered, thereby being actually higher in fine line printing. Sixthly, adhesion strength of conductor layer is larger than that in the thick film method.

The green tape method, however, is defective in that a large design change is difficult; it is dangerous to be processed at a high temperature and to require a hydrogen atmosphere to result in a high fabrication cost; and the conductor is higher in electrical resistance than Au, Ag or Cu and not to be soldered, thereby requiring the surface treatment for plating Ni or Au on the surface.

The green tape laminating method is similar to the green tape printing method, but different in the multilayering process of laminating a number of green tape printed conductors and formed through holes.

This method is effective for a large number of laminations, but requires molds or jigs as many as the laminations for the through hole processing to the green tape and is low in a degree of freedom for design change, thereby having been not as popular as the green tape printing method.

Next, paying attention to the metallized conductive material used for the ceramic substrate, the thick film method uses Au, Ag/Pd or Cu, and the green tape method, W, Mo or Mo-Mn. The Au and Ag/Pd are fired in air, but this method is expensive due to noble metals. Also, the green tape method, which sinters the ceramic substrate at a high temperature of 1500° C. or more, has a problem in that only high melting point metal, such as W, Mo, or Mo-Mn, is usable. Hence, at present a Cu metallized substrate has been noted which is low in conductor resistance, generates no migration phenomenon, and is good in soldering. So, the Cu metallized wiring substrate is already put into practical use.

But, there is a drawback in the Cu metallized substrate because of using the base-metal. The reason for this is that the base metal, when fired in air, is oxidized not to obtain the conductivity, and that in order to obtain the adhesive property sheet resistance, and soldering property of the wiring and to eliminate decomposition of organic binder in the paste, very delicate atmosphere control including some oxygen in the nitrogen atmosphere is required.

Furthermore, in a case where a glazed resistor and a dielectric are formed after the Cu conductor is formed, the firing atmosphere as the same as the above-mentioned is required. However, such resistor and dielectric usable in this condition are rare and the degree of freedom for selection is very little. Nevertheless, the merit of the base metal conductor material represented by Cu is attractive.

Now, in consideration of the future of the multilayer substrate, it will be ideal to use the base metal material as the conductor material and to utilize the green tape method for the multilayer method. In other words, a base metal conductor, such as copper, is printed on the green tape and the insulating layer is printed or laminated in multilayers so as to obtain the multilayer substrate.

However, there are some problems to be solved in order to put the base metal multilayer substrate into practical use. A first problem is created in that since the melting point of Cu, the typical base metal, is low at a temperature of 1083° C., it is necessary for sintering simultaneously with the substrate material to keep the sintering temperature thereof lower than the aforesaid melting point. It is indispensable to satisfy mechanical strength of sintered body, break-down voltage, moisture resistance and thermal conductivity required to the substrate material, and further the performance, such as metallizing property of Cu, is required when multilayered. A second problem is that it may be difficult to use the binder under such sintering condition of temperature or atmosphere. In other words, the organic binder used for the sheet or the paste has a property of non-decomposition in a nonoxidizing atmosphere. Unless the binder is completely decomposed and removed, the ceramic body itself remains porous, whereby not only the sintering does not proceed but also the substrate becomes blackish due to the residual carbon.

For the aforesaid simultaneously sintering substrate material, glass-ceramic material has generally been developed, which is disclosed in, for example, U.S. Pat. Nos. 3,977,887 and 4,301,324. The decomposition and removal of the binder is disclosed in Japanese Laid-open Patent Application No. 55-128899.

SUMMARY OF THE INVENTION

An object of this invention is to provide a method for readily and inexpensively manufacturing a multilayer ceramic body using copper as a conductor material.

To achieve this object, in the first step of the manufacturing method of this invention, on a green tape, being an dielectric composition composed of a mixture of a ceramic composition and a glass composition containing lead oxide, a pattern-forming is made by way of screen printing with a conductor paste composition with oxide of a base metal copper as its main component, and a desired number of sheets of the aforementioned pattern formed green tape and another pattern formed green tape are integrally laminated, thereby forming a raw laminate. Or on the green tape, the aforementioned conductor paste and an insulating paste of a dielectric composition are alternately screen-printed in multilayered thick film, thereby forming a raw laminate. Or on an already sintered substrate formed of glass or ceramic or their mixture, a conductor paste composition composed of the aforementioned oxide of copper and a dielectric paste composition composed of a mixture of ceramic and a glass composition containing lead oxide are alternately formed in multilayers by the screen printing method, thereby forming a raw laminate. Subsequent processes comprise: a step of subjecting the aforementioned laminate to a heat-treatment under partial pressures of oxygen which provide adequate oxidizing atmosphere for carbon (as in air) at temperatures below the softening point of glass of the glass composition containing lead oxide in the aforementioned dielectric composition, thereafter, a step of heat-treating it in a mixed gas atmosphere of hydrogen and nitrogen at temperatures higher than the temperature required for reducing the aforementioned oxide of copper but lower than the temperature at which the lead oxide in the aforementioned dielectric composition is reduced to metal lead, and further, a step of subjecting the aforementioned already reduced laminate to a heat treatment at temperature required for sintering the aforementioned dielectric composition in nitrogen atmosphere under oxygen partial pressures such that reduction of the aforementioned lead oxide compound will not occur.

DESCRIPTION OF THE PREFERRED EMBODIMENTS

Figure 1:
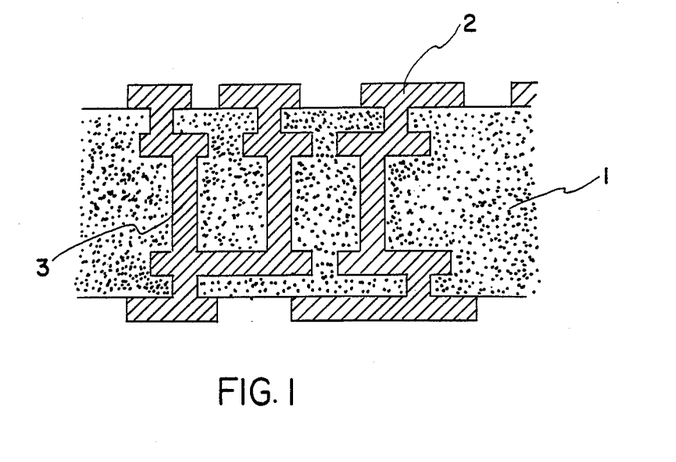
FIG. 1 is a sectional view of an embodiment of multilayer ceramic body of the invention.
Figure 2:
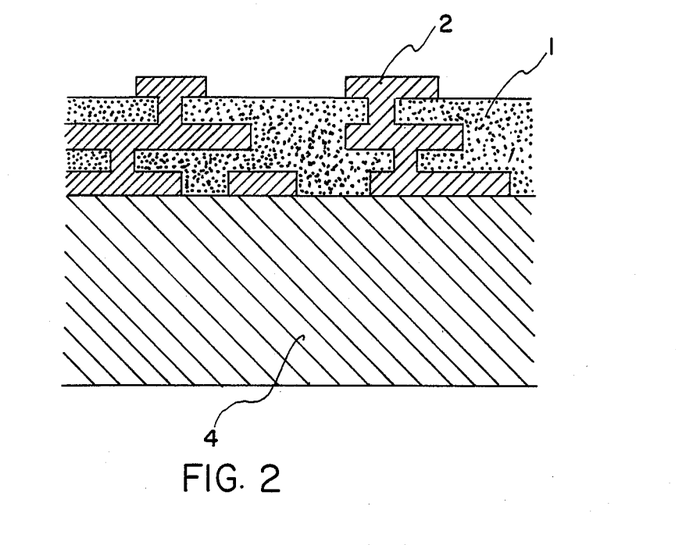
FIG. 2 is a sectional view of a modified embodiment of multilayer ceramic body of the invention.

FIG. 1 is a sectional view of a multilayer ceramic substrate manufactured by a metallizing method embodying this invention, in which:

Numeral 1 denotes a low temperature sintered substrate material consisting of a mixture of ceramic and glass containing lead oxide. Numeral 2 gives Cu electrode portions obtained by the metallizing method of this invention, and 3 represents through-hole portions of the aforementioned glass-ceramic substrate.

It has heretofore been believed to be no easy matter to obtain a multilayer substrate metallized with Cu shown in FIG. 1. This is because usually one of the following methods is used to obtain such a structure: First, a plural number of sheets of green tape composed of a low temperature sintered substrate material represented by glass and ceramic and an organic binder like polyvinyl butyral, on which a conductor paste of Cu has been pattern-printed by the screen printing method, are piled one upon another, and integrally bonded by way of thermal compression, to form a multilayer body. Or alternate printing and drying of an dielectric paste of the same inorganic composition as that of the aforementioned green tape and the aforementioned Cu conductor paste is repeated on the aforementioned green tape by the screen printing method, to form a multilayer body. Then by sintering the multilayer body in a nitrogen atmosphere, a Cu metallized multilayer substrate is obtained.

However, it is difficult to use the organic binder for the firing in nitrogen atmosphere, because it is difficult to completely remove the organic binder included in the green tape or the dielectric paste by thermal decomposition in the non-oxidizing atmosphere and at a temperature of sintering glass-ceramic. It is well known that although most of the binder is removed, a small part of the binder remains in the state of carbon. The residual carbon largely affects the sintering of the galss-ceramic material so that a dense sintered body is not obtainable. Hence, in actual firing, it is necessary for removal of the binder to add some oxygen in the atmosphere to thereby promote decomposition of binder.

If an excessive amount of oxygen (or air) is added however, oxidization of copper metal will occur. Therefore, the firing atmosphere requires delicate control.

What is intended by this invention surely lies in serving both ends of binder removal and Cu metallizing, and it is also its object to provide a method of using a low temperature firing substrate material using glass containing lead oxide, which permits firing at further lower temperatures, and which is effective in various aspects.

Thus, according to the method of this invention, the multilayer laminate is formed by utilizing as the conductor paste a paste required from oxide of Cu as its starting material and as the insulating material the aforementioned glass-ceramic low temperature firing material containing PbO. Then the laminate is subjected to a heat treatment in an oxidizing atmosphere as in air or in oxygen, etc., thereby to make removal of organic binder. This step is called burn-out process. Thereafter, come a step (reduction process) which is conducted under conditions (temperature and reducing atmosphere) such that PbO in the aforementioned insulating material is not reduced, but that the cupric oxide in the aforementioned conductor paste is reduced, and a step (firing process) of heat treatment performed in nitrogen for sintering the aforementioned insulating material and copper metal.

Besides, by taking a step of printing the uppermost layer metal Cu electrodes in-between the aforementioned reduction and firing processes, highly reliable uppermost layer Cu metallization may be achieved.

In the following, the reason why these are realizable will be described:

At first, regarding the binder removing process according to the method of the invention, since the copper-oxide to be metallized is used, under the thermal treatment even in air, the oxide causes no change in volume, and only thermal decomposition of organic binder is carried out. At this time the thermal decomposition should be carried out at a temperature lower than the softening point of the glass composition of glass-ceramic material used as the insulating material. The reason for this is that when sintering of the laminate comprising the copper oxide and insulating material proceeds excessively, copper is sealed as the oxide inside the multilayered body and not reduced even in the subsequent reduction process. Also, the copper-oxide proceeds to rapidly diffuse into the dielectric layer, thereby not maintaining the electric insulation property. At this time usable metallizing material is limited to Cu, because oxides of Cu exist stably even at a temperature of enabling the binder to be removed. On the other hand, for example, the base metals, such as W and Mo, can be present at a state of oxide $WO_3$ or $MoO_3$, but will sublimate at the temperature and in the atmosphere as above-mentioned, thereby not constituting the laminate body. Thus, they are not effective for the method of the invention.

Also, in a case where the volume change and unnecessary diffusion occur by unnecessary crystal transformation in the aforesaid temperature region even for the oxide of Cu, the body also can not be constructed. Therefore, the method of the invention desirably uses CuO as the oxide of Cu. In other words, since CuO is stable even in air even when the temperature is raised in this condition, no crystal transformation occurs and also particle sizes of the power are selected to enable control of shrinkage rate, thereby enabling one to make the multilayer body integrally with glass-ceramic and metal.

In addition, in a case of using another oxide, for example, $Cu_2O$, it forms CuO due to a temperature rise in air, so as to cause a change in volume, but is said to exist as $Cu_2O$ in a range of $10^{-3}$ to $10^{-5}$ of partial pressure of oxygen, thereby enabling thermal decomposition of organic binder. The oxygen partial pressure, however, is difficult to control in the above-mentioned, which does not answer the objective of the invention.

The second step is a reduction process. The starting conductor material of this invention is CuO. Accordingly, it is reduced at very low temperatures to form copper; therefore, it is possible to accomplish the reduction at temperatures lower than the softening point of the aforementioned glass-ceramic, and thus to reduce the copper oxide in the interior at the stage before the aforementioned laminate has been sintered.

On the other hand, if any components in the insulating material exist which may be reduced under the conditions of this reducing process, the method of this invention will fail to serve the end. Because, if any metal oxide, for example, in the insulating material is reduced by the reduction process, its function an an insulator cannot be discharged.

It has, heretofore, been believed that there is a limit for insulating materials which are usable for copper multilayer substrates. The reason is because they need to be composed of components which are chemically inert to the aforementioned copper conductor. Thus for example, in a system containing a metal oxide such as PbO, etc., in the aforementioned glass-ceramic material, a reaction represented by PbO+aMe→Pb+Me$_a$O (where Me: metal)

will take place; as a result, Pb will exist in the insulating material, causing a loss of its function as a dielectric layer. Accordingly, generally, it is believed to be difficult to realize the Cu multilayer substrate with a system containing PbO. It is believed necessary that the insulating material should be selected from among metal oxides, such as $Al_2O_3$, BaO, $B_2O_3$, $SiO_2$, CaO, MgO, $Na_2O$, $Ta_2O_5$, $Nb_2O_5$, $Li_2O$, $K_2O$, etc., which are thermodynamically stable, so that they would not undergo oxidation and reduction reactions with Cu. And it has become accepted opinion that PbO containing glass is finding applications only in multilayer substrate utilizing electrodes of such noble metals as As, Pd or Au, etc., and that it is hardly usable in system making use of Cu.

On the other hand, substrate materials composed of lead free glasses as above-mentioned involve many inadequacies in their substrate function. For example, the aforementioned materials give low insulating resistance and improper dissipation factor (tan$\delta$). Besides, their softening points are high; as a consequence, they involve problems that the sintering temperature can not be much lowered, resulting in difficulty making firing in short time. However, systems containing PbO are highly reliable as substrate materials, and have a possibility of providing substrate highly adaptable for quantity production.

This invention has as its object providing Cu multilayer substrates using insulating materials composed of lead oxide containing glass. Thus it provides a method for making reduction under specified conditions (at temperature between $200°\sim 500°$ C. and in an atmosphere of a mixed gas of $N_2$ and $H_2$), with attention paid to the fact that thermodynamically a region exists where reduction of PbO does not occur, but reduction of CuO takes place.

Thirdly comes the sintering process. In this process, with binder already burnt out, it is only necessary to make the sintering of the aforementioned insulating material, while taking account of Cu metallization without reducing PbO. Thus the system should be raised to the sintering temperature of the aforementioned glass-ceramic in nitrogen atmosphere under oxygen partial pressure (desirably, the $O_2$ concentration should be $1\sim 40$ ppm) where oxidation of Cu and reduction PbO do not occur.

In this way, proper metallization is achieved due to the sintering of the aforementioned glass-ceramic and that of Cu particles. However, if the firing were conducted in atmospheres more towards the reduction side, and not under the aforementioned oxygen partial pressures, adequate metallization of Cu could not be achieved; not only that, but in more reducing atmospheres, reduction of lead oxide would occur, resulting in loss of insulation characteristic. Such a problem in Cu metallization is said to result from the fact that glass and ceramic in the dielectric layer are generally not well wettable with metal. On the basis of this fact, better firing may be done, taking advantage of wettability of oxide, in neutral atmosphere in which some oxide layer tends to be formed on the surface of Cu.

It goes without saying that the metallizing method of this invention is not limited to ceramic multilayer substrates, but that it may be applicable to metallization of multilayer ceramic capacitors.

This invention will become more apparent from the detailed descriptions taken in connection with a few of its preferred embodiments:

EXAMPLE 1

First, for the ceramic substrate material, lead-borosilicate glass powder (mean particle diameter $1.8 \sim 2.0$ $\mu m$) mixed with alumina powder ($Al_2O_3$, mean particle diameter of $1.0$ $\mu m$) in a ratio by weight of 50 to 50, as shown in Table 1, was used.

TABLE 1

| Component | weight % | | |
|---|---|---|---|
| | A | B | C |
| $SiO_2$ | 20 | 20 | 20 |
| $Al_2O_3$ | 5 | 5 | 5 |
| CaO | 2.5 | 5 | 2.5 |
| BaO | 2.5 | 5 | 7.5 |
| $B_2O_3$ | 5 | 2.5 | 5 |
| PbO | 15 | 12.5 | 10 |
| $Al_2O_3$ | 50 | 50 | 50 |

The mixed powder was used as an inorganic component for the substrate material, polyvinyl butyral as an organic binder, di-n-butyl phthalate as a plasticizer, and a mixture (in a ratio of 30 to 70) of toluene and isopropyl alcohol as a solvent, which were mixed in composition shown in Table 2 and slurried.

TABLE 2

| Component | Mixing Ratio | Weight |
|---|---|---|
| Inorganic Component | 100 parts | 20 kg |
| Polyvinyl Butyral | 12 parts | 2.4 kg |
| Di-n-Butyl Phthalate | 5 parts | 1 kg |
| Toluene/Isopropyl Alcohol | 40 parts | 8 kg |

This slurry was sheet-molded by the doctor blade method on an organic film (Rumiller ® 125 $\mu m$ thick), at which time the system was used which carries out in continuation the processes of making a film, drying, punching into a desired sheet form, and through hole processing at need. The not-sintered substrate obtained as above-mentioned is called the "green tape". The green tape obtained is sintered at a temperature of 900° C. in air for 20 min. to form a dense sintered body.

Properties of the substrate materials prepared in this way are listed in Table 3:

TABLE 3

| Properties | A | B | C |
|---|---|---|---|
| Specific dielectric constant | 8.9 | 8.9 | 9.5 |
| Dissipation factor tan δ % | 0.25 | 0.24 | 0.40 |
| Flexural strength $Kg/mm^2$ | 20 | 18 | 24 |

TABLE 3-continued

| Properties | A | B | C |
|---|---|---|---|
| Insulating resistivity $\Omega \cdot cm$ | $6 \times 10^{14}$ | $3 \times 10^{14}$ | $1.6 \times 10^{13}$ |
| Softening point °C. | 650 | 655 | 610 |

Next, CuO paste of main component of CuO powder was used to screen-print the conductor pattern on the green tape. The CuO powder had mean particle size of 2.5 $\mu m$. The vehicle composition for forming paste used a solution of ethyl cellulose as the organic binder in turpentine oil as the solvent, which was kneaded by a three-roll blending machine with an inorganic composition of the main component of the CuO powder, thereby forming paste for conductors.

Mixing composition of this CuO paste is shown in Table 4:

TABLE 4

| Component | Weight % |
|---|---|
| CuO | 76.0 |
| Glass frit (#7059 3 $\mu m$ manufactured by Corning Co.) | 4.0 |
| Vehicle | |
| Solvent - turpentine oil | 17.0 |
| Organic binder - ethyl cellulose | 3.0 |
| Total | 100.0 |

Then a desired number of sheets of the green tape on which the aforementioned CuO conductor paste had already been printed were laminated, and bonded by thermal compression under conditions of temperature being 60° C., and pressure 150 $kg/cm^2$. At this time, the green tape thickness was set at $200 \sim 300$ $\mu m$. The green tape laminate obtained in this way was subjected to a heat treatment according to the binder burn-out method of this invention.

Figure 3:
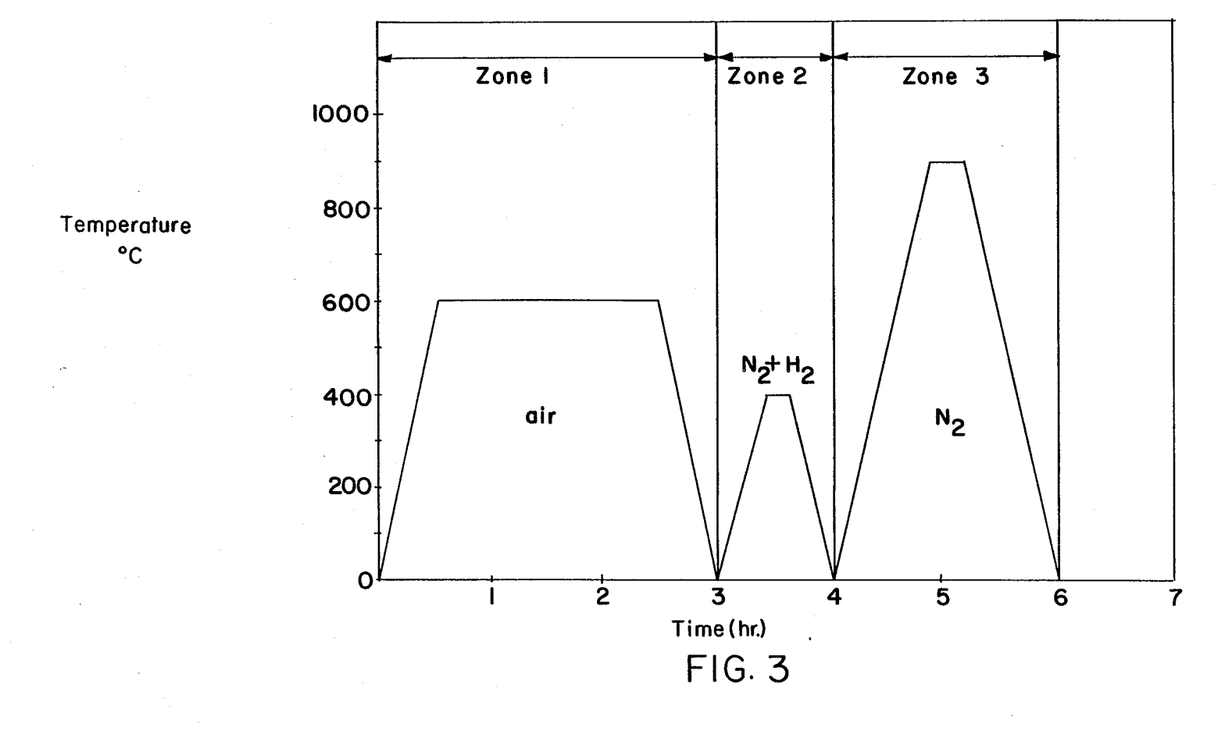
FIG. 3 is a graph exemplary of the temperature and atmosphere profile of binder removing process, reduction process, and sintering process, in the manufacturing method of the invention.

FIG. 3 shows an example of the binder removing system, in which the heat treatment of the temperature profile shown in Zone 1 was carried out in air. The organic binder in the green tape and the organic component in the paste were almost thermal-decomposed and the organic components were removed completely. The binder removing temperature and the atmosphere were set by confirming previously carrying out thermal analysis as to whether or not the binder had been completely removed. Accordingly, the decomposition temperature was somewhat different due to the kind of binder, and thus the binder removal setting temperature was of course different.

At this time, when the surface of the multilayer body after removal of the binder was observed by a scanning electron microscope, there was found no change in particle size of the starting material for the glass-ceramic material. Also, the softening of glass component was not confirmed, or the organic binder only had been diffused.

This means that the binder had been removed at a temperature lower than the softening point of glass component.

The removal of decomposition of the polyvinyl butyral binder used according to this invention was examined by analyzing the carbon left undecomposed by the heat treatment in air. The results: after decomposition at 500° C. ( for 2 hr), approx. 150 ppm carbon was detected; at 550° C., 80 ppm carbon; and at 600° C., it was approx. 10 ppm, showing that adequate removal by decomposition has been accomplished. By such a method as hereabove-described, the condition for decomposition were determined. In this embodiment, the binder removal was carried out at 600° C.

Next, this laminate from which binder had been removed was subjected to reduction treatment. The conditions for this are illustrated by Zone 2 in FIG. 3. The electric furnace used was a mesh-belt furnace of BTU Engineering Co. This treatment was carried out in an atmosphere of nitrogen gas containing 10% of hydrogen gas, under conditions of the peak temperatures being set at 50° C. intervals from 200° C. to 700° C., with the holding time of 10 min, and taking 60 min from charge-in to take-out.

The results were that below 250° C., no reduction of the CuO part inside the laminate was recognized, with the sheet resistance infinitely increasing. The product reduced at temperatures between 300° C.~500° C. showed small enough values of sheet resistance (2~4 m$\Omega$/□) for it to be practically used in wiring. When the insulation resistance of the substrate material was evaluated, degradation in the insulating property was recognized under a temperature condition of higher than 600° C. From this, it may be considered likely that at higher than 600° C., PbO contained in the substrate material is reduced, resulting in deterioration in the insulation characteristic. The reason whey the sheet resistance of Cu electrode is high at above 600° C. is believed to have resulted from lowered melting point due to formation of an alloy from the reduced Pb and Cu and its melting-out in the following firing process.

The above-described result suggests that the reduction condition is optimal at 300° C.~500° C. In this embodiment, the reduction was performed at 400° C.

Finally, the sintering process was executed, following the profile shown by Zone 3 in FIG. 3. The electric furnace used was a mesh-belt furnace of BTU Engineering Co. The process was run under conditions of the peak temperature being 900° C., holding time 20 min and the time from charge-in to take-out 120 min and in a nitrogen atmosphere (oxygen concentration 1~10 ppm). Results are as shown in Table 5:

TABLE 5

| Specimen No. | Substrate material | Sheet resistance m$\Omega$/□ | Adhesive strength kg/4 mm$^2$ | | Solderability |
|---|---|---|---|---|---|
| | | | Initial | 150° C. 100 hr after | |
| 1 | A | 1.68 | 1.98 | 1.50 | Excellent |
| 2 | B | 1.75 | 1.51 | 1.20 | Excellent |
| 3 | C | 1.77 | 1.46 | 1.15 | Excellent |

The sheet resistance, adhesive strength and solder wettability were measured under the following conditions: The sheet resistance was calculated from the result of measurement taken with an ohmmeter across two ends of the conductor pattern of wire width being 250 $\mu$m, and length 25 mm. The solder wettability was qualitatively judged by dipping the aforementioned substrate into a solder dipping tank, with the scores given by excellent and good representing practically usable range. As for the adhesive strength, a 0.8 mm $\phi$ lead wire was soldered (with a 60 Sn and 40 Pb solder) on a 2 mm square electrode pattern perpendicularly to the substrate, and the measurement was taken with a tensile tester as a junction strength between the substrate and the lead wire.

Table 5 clearly shows that the copper multilayer substrates manufactured as embodiments of this invention give high enough performance values to be of practical use. From the results, it may be asserted that not only the firing can be done at such a low temperature as 900° C. and in short time, but the product is excellent insulation, dielectric property, metallizing performances (adhesive strength, sheet resistance and solder wettability).

EXAMPLE 2

With a 96% Al$_2$O$_3$ substrate (0.8 mm thick) which had been sintered as the base, the following dielectric paste and conductor paste was multilayered by the thick-film screen-printing method. For the dielectric paste, powder of the same composition as that (Table 1) of the substrate material mentioned in Example 1 was used. As for the vehicle composition for preparing the pastes, use was made of turpentine oil as a solvent and ethyl cellulose as an organic binder, forming a solution therewith. The aforementioned insulating powder and the vehicle were kneaded into a dielectric paste by a threeroll blending machine. Its detailed mixing composition is shown in Table 6:

TABLE 6

| Component | Weight % |
|---|---|
| Inorganic material (A, B, C) | 80 |
| Vehicle | |
| Solvent - turpentile oil | 17.5 |
| Organic binder - ethyl cellulose | 2.5 |
| Total | 100.0 |

For the conductor paste, the copper oxide paste mentioned in EXAMPLE 1 was used as it was. (Table 4)

As for the particular manufacturing method of multilayer, first, the pattern formation of the aforementioned CuO paste was made on the aforementioned alumina substrate by the screen printing method. As the printing conditions at this time, a 10 $\mu$m thick emulsion plate on a 325 mesh stainless screen was utilized. The thickness after drying (150° C.—10 min) was approx. 15 $\mu$m. Then a dielectric layer was formed with a dielectric paste. As the dielectric paste printing method, screen printing was made, using 20 $\mu$m thick emulsion on a 250 mesh stainless screen in such a way that its thickness would become approx. 60 $\mu$m by twice printing and drying. The printing of CuO paste and dielectric paste was repeated the desired number of times, thereby forming a multilayered laminate.

In addition, when the CuO paste and dielectric paste are produced, instead of the turpentine oil and ethyl cellulose, cellulose nitrate as the organic binder and cellulose solvents, such as butyl carbinol or butyl cellulose, may be used and also it is effective to use a surfactant, such as sorbitan alkyl ester and polyoxyethylene alkyl ether.

Then the binder removal, reduction and firing processes were executed under the same conditions as in EXAMPLE 1. Results are given in Table 7:

TABLE 7

| Specimen No. | Substrate material | Sheet resistance m$\Omega$/□ | Adhesive strength kg/4 mm$^2$ | | Solderability |
|---|---|---|---|---|---|
| | | | Initial | 150° C. 100 hr after | |
| 4 | A | 1.74 | 2.06 | 1.70 | Excellent |
| 5 | B | 1.83 | 1.67 | 0.98 | Excellent |
| 6 | C | 1.76 | 1.47 | 1.29 | Excellent |

The laminate produced turned out to have high enough properties for practical use just as in EXAMPLE 1. In contrast to EXAMPLE 1, in the method of forming multilayers on an aluminum substrate, unlike the green tape method, the flexural strength poses no problem, and it is proper to take account of the insulating property only. Therefore, this method is optimal for multilayer substrates having not large number of layers (on the order of up to only 4 layers). Besides, in the embodiment with an alumina substrate base, especially, even if the temperature raising speed is high, as a condition of binder removal, the sintered body will never be cracked. Thus this method is more advantageous than the green tape method.

EXAMPLE 3

Multilayer formation was made with a CuO paste and an dielectric paste by the thick film screen printing method, using an alumina sintered substrate (0.6% alumina). In the following, the details are given: The CuO paste for inner layer used was one of the composition shown in Table 4. It was printed under the similar screen printing conditions as in EXAMPLE 2. Then the dielectric paste used was one having the insulating material of the composition containing lead oxide glass shown in Table 8, as its organic component, which was kneaded with a vehicle added just as in the case of the conductor paste.

TABLE 8

| Insulating material | (Part by weight) | | |
|---|---|---|---|
| | D | E | F |
| Glass composition | | | |
| $SiO_2$ | 63.1 | 61.6 | 57.0 |
| $Al_2O_3$ | 0.3 | 0.3 | 1.5 |
| CaO | 1.0 | 0.2 | 0.2 |
| MgO | — | — | 0.2 |
| PbO | 20.2 | 22.6 | 29.4 |
| $Na_2O$ | 7.9 | 12.8 | 4.1 |
| $K_2O$ | 8.4 | 2.5 | 7.6 |
| Ceramic material | 100 | 100 | 100 |
| $Al_2O_3$ | part | part | part |

The aforementioned glass component was prepared by preliminarily melting the glass composition at high temperatures, quenching it by letting it fall into water, and thereafter, pulverizing it in wet state until its mean grain size has become approx. 2.0 μm. And as a ceramic material, alumina powders with means grain size of 0.8 μm were mixed therewith.

A multilayer body was formed by using the CuO conductor paste for inner layer and the dielectric paste prepared as hereabove-described. Thus on the aforementioned alumina substrate, a wiring pattern was formed with the CuO conductor paste for inner layer by the screen printing method, and after drying, the dielectric paste was further screen-printed thereon. The multilayer body was formed by repeating these processes the specified number of times. At this time, the uppermost layer wiring was not printed, but the dielectric layer was so formed as to provide through holes at required parts. Thus a multilayer body with the uppermost layer wiring only not provided was prepared. Then binder removal from the unfired laminate body was made. The softening points of insulating glasses used for D, E and F used in this embodiment were 626° C., 619° C. and 630° C., respectively, and since ethyl cellulose was used as the binder, this process was conducted at a temperature of 600° C. Thereafter, reduction was performed. The condition for this was just as shown in FIG. 3; thus it was run at a temperature of 400° C.

Next, on the uppermost layer part of this already reduced laminate, a wiring pattern was screen-printed with metal copper paste (#9153, manufactured by E.I. DuPont DE NEMOURS & CO. Inc), followed by drying (120° C.—10 min).

Finally, the firing process was executed continuously in a nitrogen atmosphere in a meshbelt furnace. (Belt width 200 mm, manufactured by BTU Engineering Co.). The $O_2$ concentration at this time was 1~2 ppm, as measured with an $O_2$ analyzer. The temperature profile is the same as that of Zone 3 in FIG. 3.

The sintering of the aforementioned insulating material and the metallization of the uppermost layer Cu were simultaneously carried out. Characteristics of the multilayer ceramic substrate obtained in this way are put up in Tables 9 and 10. Besides, there is shown for comparison in Table 11 an example in which the upper layer Cu paste (#9153) was printed after firing the multilayer substrate, and subsequently, the laminate was again fired.

TABLE 9

| Insulating material | D | E | F |
|---|---|---|---|
| Insulation characteristics | | | |
| Insulation resistance $\Omega \cdot m$ | $7 \times 10^{14}$ | $5 \times 10^{13}$ | $3.9 \times 10^{14}$ |
| Dielectric constant | 7.5 | 8.9 | 8.8 |
| tan δ (%) | 1.0 | 0.55 | 0.8 |

TABLE 10

| Insulating material | D | E | F |
|---|---|---|---|
| Cu—Metallizing performances | | | |
| Sheet resistance mΩ/□ | 1.45 | 1.55 | 1.48 |
| Solderability | Excellent | Bad | Excellent |
| Adhesive strength kg/4mm² | 3.20 | 1.60 | 2.98 |

TABLE 11

| Insulating material | D | E | F |
|---|---|---|---|
| Cu—Metallizing performances | | | |
| Sheet resistance mΩ/□ | 1.46 | 1.51 | 1.50 |
| Solderability | Bad | Bad | Good |
| Adhesive strength kg/4mm² | 2.58 | 1.20 | 2.01 |

Table 9 and 10 clearly show that by forming the uppermost layer with use of a Cu paste, printing it after the reduction, and then, co-firing with the insulating material, highly reliable metallization is achieved.

The comparison of Table 10 with Table 11 suggests that simultaneous firing of the uppermost layer Cu paste and the dielectric paste will result in higher adhesive strength and better solderability. Since the number of times of firing is reduced from that required by the conventional method in which the formation of the uppermost layer is made after firing the multilayer body, this method may be said to be a manufacturing method highly adaptable for mass-production.

While in this embodiment, a multilayer body with alumina substrate as the base is illustrated, it goes without saying that use of the green tape method as shown in EXAMPLE 1 is effective. In the case of laminate from green tape, however, handling care is essential for the laminate because of its weakness after the binder removal and the reduction processes. If the binder removal is performed with the temperature raised to the range where reducton of CuO is feasible (e.g., 700° C.~800° C.), then, it will have a certain degree of strength to permit printing of Cu paste.

What is claimed is:

1. A method of manufacturing a multilayer ceramic substrate comprising the steps of:
    producing a multilayer laminate by preparing a plurality of green tapes each being made of a mixed composition of ceramic and glass containing lead oxide with addition of at least an organic binder and a plasticizer, forming on each of the plurality of green tapes a pattern of a paste containing cupric oxide (CuO) as its main component, and laminating the thus obtained green tapes;
    removing the organic binder in the multilayer laminate by heating the multilayer laminate in air at a temperature at which the organic binder is decomposed and scattered;
    reducing cupric oxide (CuO) to copper (Cu) by heating the multilayer laminate in a mixed gas atmosphere of hydrogen and nitrogen at a temperature within the range at which cupric oxide is reduced but lead oxide is not reduced; and
    sintering the multilayer laminate in a nitrogen atmosphere.

2. The method according to claim 1, wherein the temperature range in the reducing step is from 300° C. to 500° C.

3. The method according to claim 1,
    wherein the multilayer laminate producing step further comprises in the step of laminating, as an uppermost layer of the multilayer laminate, a green tape which has the same composition as that of each of the plurality of green tapes but does not have formed thereon a pattern of the CuO-containing paste, and
    wherein said method further comprises, after the sintering step, a step of forming on the uppermost layer a pattern of a paste containing copper (Cu) in the form of metal as its main component, and a step of sintering in a nitrogen atmosphere the pattern of the Cu-containing paste formed on the uppermost layer of the multilayer laminate.

4. The method according to claim 1,
    wherein the multilayer laminate producing step further comprises in the step of laminating, as an uppermost layer of the multilayer laminate, a green tape which has the same composition as that of each of the plurality of green tapes but does not have formed thereon a pattern of the CuO-containing paste, and
    wherein said method further comprises, between the reducing step and the sintering step, a step of forming on the uppermost layer a pattern of a paste containing copper (Cu) in the form of metal as its main component.

5. A method of manufacturing a multilayer ceramic substrate comprising the steps of:
    producing a multilayer laminate by preparing a green tape made of a mixed composition of ceramic and glass containing lead oxide with addition of at least an organic binder and a plasticizer, preparing a paste containing cupric oxide (CuO) as its main component, preparing a dielectric paste having the same composition as that of the green tape, and alternately printing on the green tape the CuO-containing paste and the dielectric paste to form a multilayer structure in which patterns of the CuO-containing paste and layers of the dielectric paste are alternately laid;
    removing the organic binder in the multilayer laminate by heating the multilayer laminate in air at a temperature at which the organic binder is decomposed and scattered;
    reducing cupric oxide (CuO) to copper (Cu) by heating the multilayer laminate in a mixed gas atmosphere of hydrogen and nitrogen at a temperature within a temperature range in which cupric oxide is reduced but lead oxide is not reduced; and
    sintering the multilayer laminate in a nitrogen atmosphere.

6. The method according to claim 5, wherein the temperature range in the reducing step is from 300° C. to 500° C.

7. The method according to claim 5,
    wherein the multilayer structure formed in the multilayer laminate producing step is so formed that a layer of the dielectric paste is formed as an uppermost layer of the multilayer laminate, and
    wherein said method further comprises, after the sintering step, a step of forming on the uppermost layer a pattern of a paste containing copper (Cu) in the form of metal as its main component, and a step of sintering in a nitrogen atmosphere the pattern of the Cu-containing paste formed on the uppermost layer of the multilayer laminate.

8. The method according to claim 5,
    wherein the multilayer structure formed in the multilayer laminate producing step is so formed that a layer of the dielectric paste is formed as an uppermost layer of the multilayer laminate, and
    wherein said method further comprises, between the reducing step and the sintering step, a step of forming on the uppermost layer a pattern of a paste containing copper (Cu) in the form of metal as its main component.

9. A method of manufacturing a multilayer ceramic substrate comprising the steps of:
    producing a multilayer body by preparing a ceramic substrate which has been sintered, preparing a paste containing cupric oxide (CuO) as its main component, preparing a dielectric paste of a mixed composition of ceramic and glass containing lead oxide with at least an organic binder and a plasticizer, and alternately printing on at least one major surface of the ceramic substrate the CuO-containing paste and the dielectric paste to form a multilayer structure in which patterns of the CuO-containing paste and layers of the dielectric paste are alternately laid;
    removing the organic binder in the multilayer body by heating the multilayer body in air at a temperature at which the organic binder is decomposed and scattered;

reducing cupric oxide (CuO) to copper (Cu) by heating the multilayer body in a mixed gas atmosphere of hydrogen and nitrogen at a temperature within a temperature range in which cupric oxide is reduced but lead oxide is not reduced; and sintering the multilayer body in a nitrogen atmosphere.

10. The method according to claim 9, wherein the temperature range in the reducing step is from 300° C. to 500° C.

11. The method according to claim 9, wherein the multilayer structure formed in the multilayer body producing step is so formed that a layer of the dielectric paste is formed as an outermost layer of the multilayer body, and wherein said method further comprises, after the sintering step, a step of forming on the outermost layer a pattern of a paste containing copper (Cu) in the form of metal as its main component, and a step of sintering in a nitrogen atmosphere the pattern of the Cu-containing paste formed on the outermost layer of the multilayer body.

12. The method according to claim 9, wherein the multilayer structure formed in the multilayer body producing step is so formed that a layer of the dielectric paste is formed as an outermost layer of the multilayer body, and wherein said method further comprises, between the reducing step and the sintering step, a step of forming on the outermost layer a pattern of a paste containing copper (Cu) in the form of metal as its main component.

* * * * *